(12) United States Patent
Mondal et al.

(10) Patent No.: US 6,930,554 B2
(45) Date of Patent: Aug. 16, 2005

(54) VARIABLE GAIN LOW NOISE AMPLIFIER AND METHOD

(75) Inventors: Jyoti Mondal, Palatine, IL (US); Neil L. Calanca, Crown Point, IN (US); Matthew R. Miller, Palatine, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/623,047

(22) Filed: Jul. 18, 2003

(65) Prior Publication Data

US 2005/0012553 A1 Jan. 20, 2005

(51) Int. Cl.[7] .............................................. H03G 3/10
(52) U.S. Cl. ..................... 330/282; 330/284; 330/311
(58) Field of Search .......................... 330/86, 278, 282, 330/284, 310, 311

(56) References Cited

U.S. PATENT DOCUMENTS

| | | | | |
|---|---|---|---|---|
| 4,564,818 A | * | 1/1986 | Jones | 330/311 |
| 6,064,265 A | * | 5/2000 | Yun et al. | 330/279 |
| 6,288,609 B1 | | 9/2001 | Brueske et al. | |
| 6,400,218 B1 | | 6/2002 | Zocher et al. | |
| 6,414,547 B1 | | 7/2002 | Shkap | |
| 6,445,248 B1 | | 9/2002 | Gilbert | |
| 6,509,796 B2 | | 1/2003 | Nguyen et al. | |
| 6,525,601 B2 | | 2/2003 | Gilbert | |
| 6,525,609 B1 | | 2/2003 | Behzad | |
| 6,535,065 B2 | | 3/2003 | Aoki | |
| 2002/0053947 A1 | | 5/2002 | Macedo | |
| 2002/0070809 A1 | | 6/2002 | Watanabe et al. | |
| 2002/0153937 A1 | | 10/2002 | Gilbert | |
| 2002/0167355 A1 | | 11/2002 | Jones | |
| 2002/0196080 A1 | | 12/2002 | Saito | |
| 2003/0001675 A1 | | 1/2003 | Costa et al. | |
| 2003/0020544 A1 | | 1/2003 | Behzad | |
| 2003/0071286 A1 | | 4/2003 | Prentice | |

OTHER PUBLICATIONS

S. Tadjpour, F. Behbahani, A. A. Abidi, "A CMOS Variable Gain Amplifier for a Wideband Wireless Receiver," 1998 Symposium on VLSI Circuits Digest of Technical Papers, 1998, p. 86–89, University of California, Los Angeles, CA.

* cited by examiner

Primary Examiner—Khanh V. Nguyen
(74) Attorney, Agent, or Firm—Vedder, Price, Kaufman & Kammholz, P.C.

(57) ABSTRACT

A variable gain control amplifier (10) and method provides a substantially constant input impedance and output impedance, and provides a substantially constant noise figure and third order harmonic. The variable gain control amplifier (10) includes an amplifier stage including at least a first intermediate fixed gain stage (22) operative to produce a first intermediate signal (30) in response to the input signal (20). The variable gain control amplifier (10) further includes at least a second intermediate fixed gain stage (24) operative to produce an output signal (18) in response to the first intermediate signal (30). A feedback circuit (16) is operative to produce a gain control signal (32) in response to the output signal (18). A gain control circuit (26) is coupled to the at least first intermediate fixed gain stage (22) and the second intermediate fixed gain stage (24), and receives the gain control signal (32) to control an amplitude of the intermediate signal (30).

21 Claims, 6 Drawing Sheets

VARIABLE GAIN LOW NOISE AMPLIFIER AND METHOD

FIELD OF THE INVENTION

The invention relates generally to a variable gain amplifier and more particularly to a device and method for varying the gain of a low noise amplifier.

BACKGROUND OF THE INVENTION

An amplifier stage is known to have variable gain by varying the gain of one or more individual intermediate stages within the amplifier stage. An amplifier stage includes two or more individual intermediate gain stages. According to one method, by varying the gain of one or more of the individual intermediate stages of the amplifier stage, the overall gain of the amplifier stage is varied. For example, each of the individual intermediate gain stages typically include a transistor based amplifier for providing gain. The gain of an individual intermediate stage is varied by changing the gain of the intermediate stage transistor; typically, by varying the DC bias of the intermediate stage transistor. This may be accomplished, for example, by changing the DC bias current through the base of a bipolar transistor, or by varying the DC bias voltage in the gate of a junction field-effect transistor.

However, changing the DC bias point of any one of the intermediate stage transistors to vary the gain of one or more intermediate amplifier stages within the variable gain amplifier may affect the input and output impedances of the amplifier stage, and may also affect the noise figure and the third order harmonic intercept of the amplifier stage. The noise figure of an amplifier stage is the ratio between the signal to noise ratio of the input of the amplifier stage and the signal to noise ratio of the output of the amplifier stage. The noise figure of an amplifier stage is an indication of the amount of noise added to the input signal by the amplifier stage. The third order intercept harmonic is related to the sum and difference of two or more signals to be amplified. Changes in the input and output impedances may cause an impedance mismatch with an input source and output load. Further, changes in the noise figure and in the third order intercept harmonic may result in the generation of excessive noise for the variable gain control amplifier.

A second method for varying the gain of an amplifier stage is to switch between different intermediate gain stages of an amplifier stage such as a cascade or cascode amplifier stage. A cascade amplifier stage usually consists of a number of intermediate stages where the output of a previous stage is coupled to the input of a subsequent stage. In addition to providing gain, the first, or input stage is usually required to provide a high input resistance in order to avoid a loss of signal level when the amplifier is fed with a high resistance source. The main function of the last, or output stage of the cascade amplifier is to provide a low output resistance in order to avoid the loss of gain where a low-valued load resistance is connected to the output stage. The cascode configuration typically is a two-transistor amplifier stage configuration that combines a common-emitter transistor circuit and a common-base transistor circuit (the common-source and the common-gate circuits in the field effect transistor (FET) case). Switching gain stages of a cascade or cascode amplifier however, will affect the amplifier's overall input and output impedance, as well as the noise figure.

Alternatively, the gain of the amplifier stage may be varied by changing the gain of one or more of the individual stages. As previously stated, varying the gain of one or more of the individual stages results in variations in the input impedance, output impedance, noise figure, and the generation of third-order harmonic signal noise. Consequently, the current methods can be unsatisfactory for maintaining required levels of input and output impedances for the amplifier gain stage and for maintaining a required noise figure level while varying the gain of the variable gain amplifier stage.

BRIEF DESCRIPTION OF THE DRAWINGS

The present invention is illustrated by way of example and not limitation in the accompanying figures, in which like reference numerals indicate similar elements, and in which.

DETAILED DESCRIPTION OF THE PREFERRED EMBODIMENT

Figure 1:
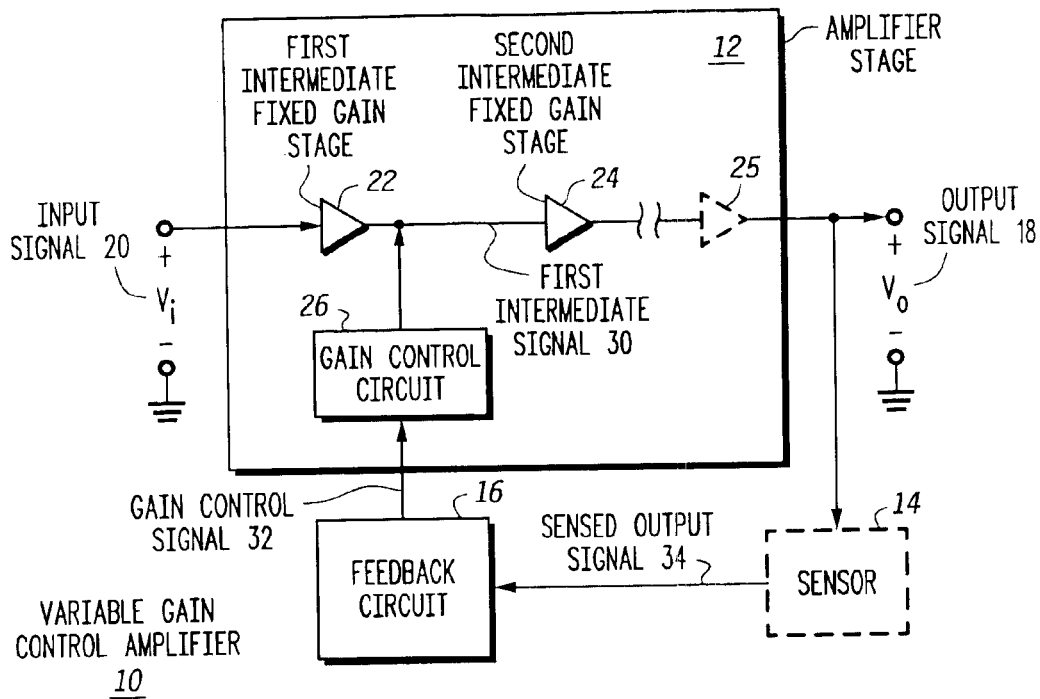
FIG. 1 is a block diagram illustrating one example of a variable gain low noise amplifier stage according to one embodiment of the invention.

A variable gain amplifier produces an output signal having a substantially constant amplitude in response to an input signal above a certain amplitude. The variable gain control amplifier has at least a first intermediate fixed gain stage to produce a first intermediate signal in response to the input signal, and at least a second intermediate fixed gain stage to produce the output signal in response to the first intermediate signal. The variable gain control amplifier includes a feedback circuit to produce a gain control signal in response to the output signal. For example, the feedback circuit is coupled to the second intermediate fixed gain stage to receive the output signal or, alternatively, the feedback circuit receives the output signal via a sensor. The variable gain control amplifier also includes a gain control circuit responsive to the gain control signal to control an amplitude of the intermediate signal. The gain control circuit automatically controls the amplitude of the intermediate signal to adjust a gain of the variable gain control amplifier in response to the gain control signal such that an amplitude of the output signal remains substantially constant. As a result, the gain of the variable gain control amplifier is adjusted without changing the gain of any of the intermediate fixed gain stages.

According to one embodiment, each individual intermediate gain stage includes a transistor based amplifier gain stage that has a fixed gain, and as a result has a fixed DC bias and a fixed small signal bias setting. Since each intermediate stage of the variable gain amplifier has a fixed DC and small signal bias setting, and therefore a fixed gain, the input and output impedances of the variable gain amplifier remain substantially constant. Changing the DC bias point of any one of the intermediate stage transistors affects not only the input and output impedances of the amplifier stage, but it also affects the noise figure and the third order harmonic intercept of the amplifier stage. Since the input and output impedances of the variable gain amplifier are substantially constant, an impedance mismatch with an input source or an output load is much less likely to occur. Additionally, since the noise figure also remains substantially constant and the third order intercept harmonic remains substantially constant, the variable gain control amplifier may have a substantially constant noise figure throughout a range of gain for the variable gain low noise amplifier.

According to one embodiment, the variable gain control amplifier is a cascode amplifier where the first intermediate fixed gain stage includes a common emitter transistor having a base to receive the input signal, an emitter coupled to a first reference potential, and a collector to produce the first intermediate signal in response to the input signal. The second intermediate fixed gain stage of the variable gain control cascode amplifier further includes a common base transistor having a base operatively coupled to a second reference potential, an emitter coupled to the collector of the common emitter transistor to receive the first intermediate signal, and a collector to produce the output signal in response to the first intermediate signal.

The gain control circuit includes a gain control transistor having a gate to receive the gain control signal, and a drain to control an amplitude of the first intermediate signal via a first intermediate reactive element, such as a DC block capacitor. The drain varies the amplitude of the intermediate signal level to control the variable gain of the variable gain amplifier.

An intermediate node formed between the collector of the common emitter transistor of the first stage and the emitter of the common base transistor of the second stage is the most buffered or isolated node from either an input or an output of the variable gain control amplifier. Consequently, a change of the amplitude of the intermediate signal level to control the variable gain of the variable gain control amplifier will have no or little effect on the input or output of the variable gain control amplifier. As a result, the substantially constant input and output impedance of the variable gain control amplifier simplifies impedance matching with other circuits, and will maintain a substantially constant impedance match. Additionally, the noise figure of the amplifier will remain substantially constant.

According to another embodiment, the variable gain control amplifier is a differential amplifier operative to produce a noninverting output signal and an inverting output signal in response to a noninverting input signal and an inverting input signal. According to this embodiment, the variable gain control differential amplifier includes a first common emitter fixed gain stage as a common emitter transistor, a first common base fixed gain stage as a common base transistor, a second common emitter fixed gain stage as a common emitter transistor and a second common base fixed gain stage as a common base transistor. A gain control circuit receives the noninverting intermediate output and the inverting intermediate output to control an amplitude of an inverting intermediate signal and an amplitude of a noninverting intermediate signal in a manner as described above.

A wireless device includes the variable gain control amplifier and an antenna operative to receive an input signal. The variable gain control amplifier receives the input signal and produces the output signal. The wireless device further includes a receiver to receive the output signal from the variable gain control amplifier.

A method for controlling a variable gain of an amplifier, such as a variable gain control amplifier, includes producing the intermediate signal in response to an input signal by at least the first intermediate fixed gain stage. At least the second intermediate fixed gain stage produces the output signal in response to the intermediate signal. The gain control circuit produces the gain control signal in response to the output signal and controls the amplitude of the intermediate signal in response to the gain control signal.

FIG. 1 is a block diagram of a variable gain control amplifier 10 including an amplifier stage 12, an optional sensor 14, and a feedback circuit 16. The variable gain control amplifier 10 produces an output signal 18 in response to an input signal 20. The amplifier stage 12 includes at least a first intermediate fixed gain stage 22, at least a second intermediate fixed gain stage 24, and a gain control circuit 26. The amplifier stage 12 may be any suitable amplifier configuration such as a single-ended amplifier, a differential amplifier, a cascode amplifier and a cascade amplifier. The first intermediate fixed gain stage 22 produces a first intermediate signal 30 in response to the input signal 20. The second intermediate fixed gain stage 24 receives the first intermediate signal and contributes to the output signal 18 gain.

The feedback circuit 16 produces a gain control signal 32 in response to the output signal 18. For example, the feedback circuit 16 may be a suitably programmed microprocessor, ASIC (Application Specific Integrated Circuit), a logic circuit, or a memory device programmed such as, for example, a RAM (random access memory) or any other suitable structure operative to provide the gain control signal 32 in response to receiving the output signal 18.

According to one embodiment, the optional sensor 14 receives the output signal 18 and produces a sensed output signal 34. For example, the sensor 14 may be an attenuator or any other suitable device to sense the output signal 18. According to this embodiment, the feedback circuit 16 is coupled to the sensor 14 to receive the sensed output signal 34 and to produce the gain control signal 32.

The gain control circuit 26 is coupled between an output of the first intermediate fixed gain stage 22 and an input of the second intermediate fixed gain stage 24 and is responsive to the gain control signal 32 to control an amplitude of the first intermediate signal 30. The gain control circuit 26 controls the amplitude of the intermediate signal 30 without substantially affecting the input impedance of the first intermediate fixed gain stage 22 or an output impedance of the second intermediate fixed gain stage 24. For example, the output of the variable gain control amplifier 10 may be coupled to a receiver with a relatively simple impedance matching circuit since the output impedance of the variable gain control amplifier 10 is substantially constant. According to one embodiment, the variable gain control amplifier 10 may be a front end LNA (Low Noise Amplifier) of the receiver.

The gain control circuit 26 automatically controls the amplitude of the first intermediate signal 30 to adjust the gain of the variable gain control amplifier 10 in response to the gain control signal 32 such that an amplitude of the output signal 18 remains substantially constant. According to one embodiment, all intermediate gain stages, such as the first intermediate fixed gain stage 22 and the second intermediate fixed gain stage 24, have fixed internal gain. The gain of the variable gain control amplifier 10, as previously stated, is adjusted by controlling the amplitude of the first intermediate signal 30 in response to the gain control signal 32.

The gain control circuit 26 automatically controls the amplitude of the first intermediate signal 30 in order to keep the amplitude of the output signal 18 substantially constant. For example, as an amplitude of the input signal 20 changes above a certain amplitude, the gain control circuit 26 automatically controls the amplitude of the first intermediate signal 30 such that the amplitude of the output signal 18 remains substantially constant. The gain control circuit 26 reduces the amplitude of the first intermediate signal 30 to decrease the gain of the variable gain control amplifier 10. For example, if an amplitude of the input signal 20 increases above a certain amplitude level such that the amplitude of the output signal 18 begins to increase, the feedback circuit 16 senses the increase in amplitude of the output signal 18 and in response, the feedback circuit 16 provides a gain control signal 32 to gain control circuit 26 to decrease the amplitude of the first intermediate signal 30 until the gain control signal 32 indicates to the gain control circuit 26 that the amplitude of the output signal 18 is substantially constant. As a result, the amplitude of the output signal 18 automatically remains substantially constant. Conversely, the gain control circuit 26 increases the amplitude of the first intermediate signal 30 to increase the gain of the variable gain control amplifier 10. Therefore, the variable gain control amplifier 10 functions as an automatic gain control circuit (AGC).

Figure 2:
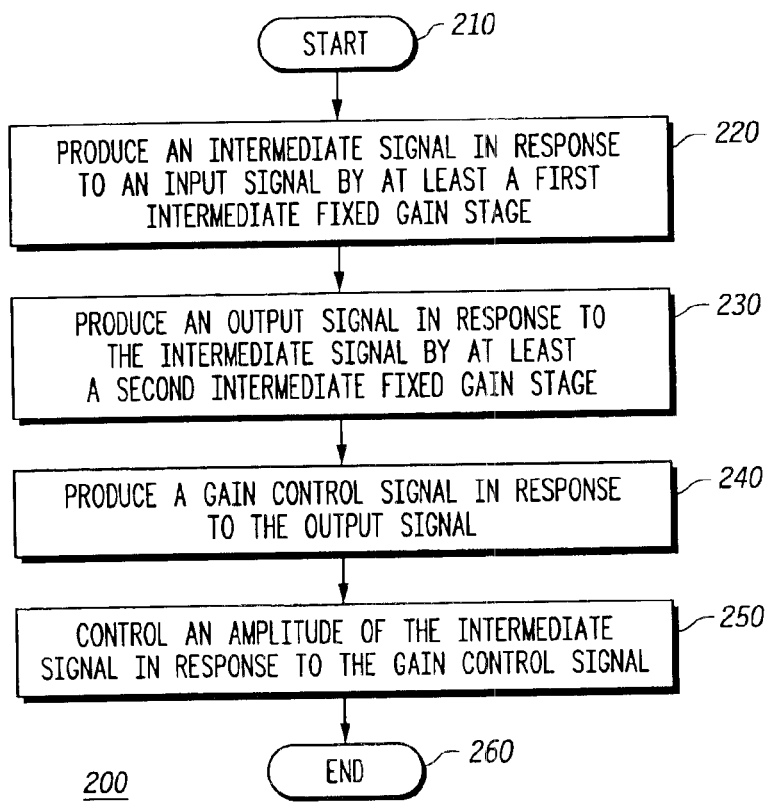
FIG. 2 is a flow chart illustrating one example of a variable gain low noise amplification method according to one embodiment of the invention.

FIG. 2 is a flow chart of a method 200 for controlling the variable gain of the variable gain amplifier 10 beginning with step 210. As shown in step 220, the variable gain amplifier 10 produces the first intermediate signal 30 in response to an input signal 20 by at least the first intermediate fixed gain stage 22. As previously stated with regard to FIG. 1, at least the second intermediate fixed gain stage 24 produces an output signal 18 in response to the intermediate signal 30 at step 230. Feedback circuit 16 produces the gain control signal 32, as shown at step 240, in response to the output signal 18. According to one embodiment, a sensor 14 produces a sensed output signal 34 in response to the output signal 18. For example, sensor 14 may be an attenuator for sampling the output signal 18 without significantly affecting the output signal 18. Accordingly, feedback circuit 16 produces the gain control signal 32 in response to the sensed output signal 34.

In response to the gain control signal 32, the gain control circuit 26 controls the amplitude of the intermediate signal 30, as shown at step 250. Although step 260 indicates an end for method 200, the gain control circuit 26 continually monitors the gain control signal 32 in order to control the amplitude of intermediate signal 30. For example, as previously stated, in response to the gain control signal 32, the amplitude of the intermediate signal 30 is automatically controlled such that an amplitude of the output signal 18 remains substantially constant. Therefore, the method 200 performs the functions of an automatic gain control circuit.

As previously stated, gain control circuit 26 reduces the amplitude of the intermediate signal 30 to reduce the variable gain of the variable gain control amplifier 10. Conversely, gain control circuit 26 increases the amplitude of the intermediate signal 30 to increase the variable gain. According to an alternate embodiment, depending on the circuit configuration of the first intermediate fixed gain stage 22 and the second intermediate fixed gain stage 24, the amplitude of the output signal 18 may be increased by decreasing the amplitude of the first intermediate signal 30. Conversely, the amplitude of the output signal 18 may be decreased by increasing the amplitude of the first intermediate signal 30. The gain of the variable gain control amplifier 10 may be linear, nonlinear, or any suitable function with respect to the amplitude of the output signal 18.

According to one embodiment, feedback circuit 16 further includes a storage element including data representing a storage element table containing at least gain control data for producing the gain control signal 32 in response to the amplitude of the output signal 18. For example, the amplitude of the output signal 18, or alternatively the sensed output signal 34, may be mapped within the storage element table, such as a memory device, to produce the gain control signal 32. According to one embodiment, the sensed output signal 34, or the output signal 18, has an amplitude that may be converted, for example, into digital data through an analog to digital converter (A/D). For example, the A/D converter may be part of the feedback circuit 16 or sensor 14. Accordingly, the digital data representing the output signal 18, or alternatively the sensed output signal 34, may address a storage location within the storage element table in order to retrieve corresponding gain control data to produce the corresponding gain control signal 32. For example, the gain control data may be converted to an analog signal to produce the gain control signal 32 through the use of a digital to analog converter (D/A). Feedback circuit 16 alternatively may be an analog control circuit, a phase locked loop (PLL) circuit, or any other suitable circuit.

Figure 3:
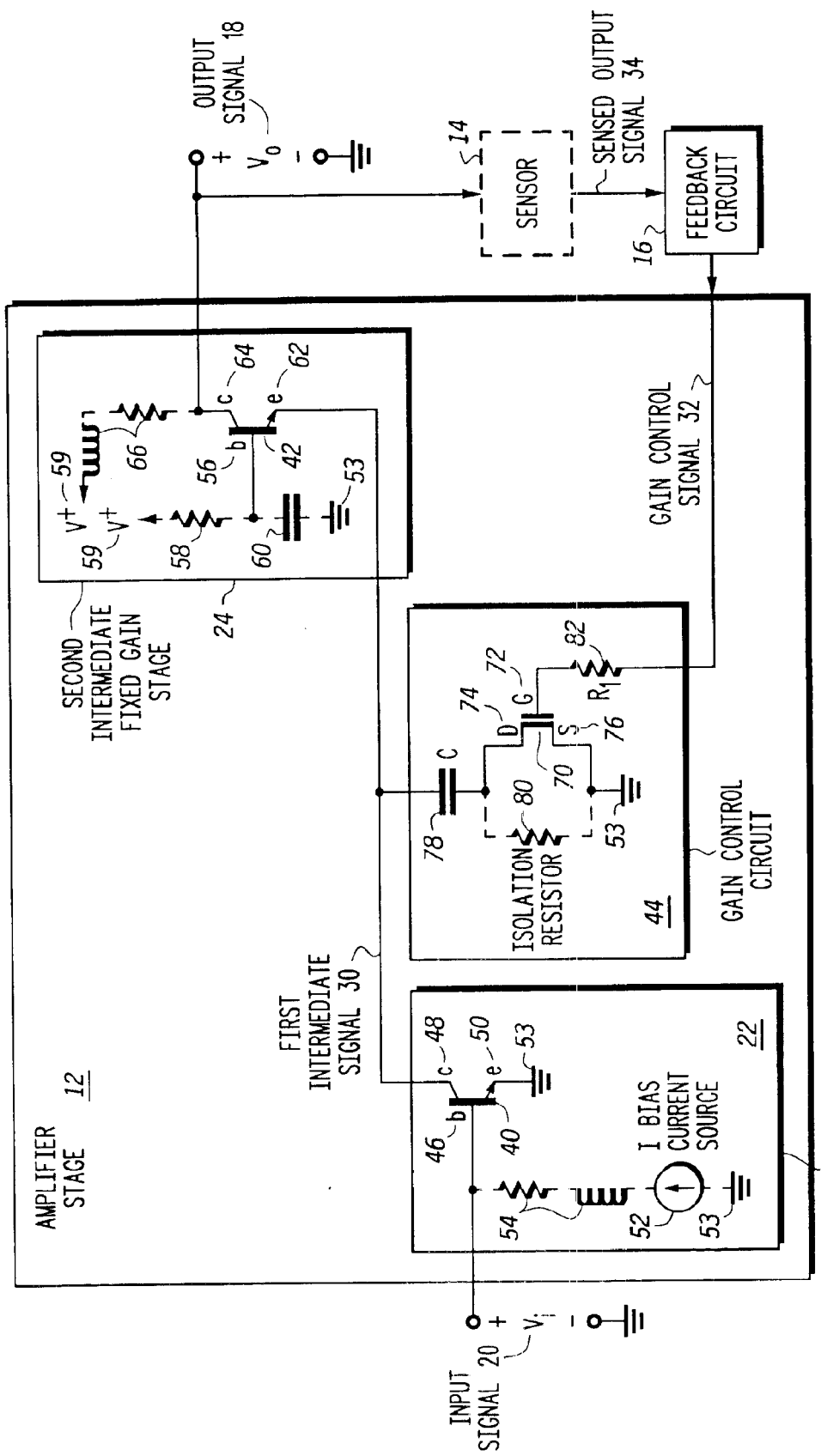
FIG. 3 is a block diagram illustrating an exemplary variable gain low noise cascode amplifier stage according to another embodiment of the invention.

As shown in FIG. 3, the amplifier stage 12 according to this embodiment is a cascode amplifier configuration, where the first intermediate fixed gain stage 22 includes a common emitter transistor 40, the second intermediate fixed gain stage 24 includes a common base transistor 42, and a gain control circuit 44 is coupled to both the common emitter transistor 40 and the common base transistor 42.

The first intermediate fixed gain stage 22 includes the common emitter transistor 40 having a base 46 operative to receive the input signal 20, a collector 48, and an emitter 50 operatively coupled to a first reference potential 53, such as a ground potential. According to one embodiment, the common emitter transistor 40 is a bipolar transistor; however, any type of transistor may be used such as a FET (Field Effect Transistor) or any suitable type of transistor. According to one embodiment, the gain control amplifier 10 may be implemented on an integrated circuit using gallium arsenide (GaAs) technology or any other suitable technology. The base 46 of the common emitter transistor 40 is coupled to an optional bias current source 52 via a bias resistor 54, or alternatively, a bias transistor, or any suitable biasing circuit. The bias current source 52 may be any suitable current source known in the art. The emitter 50 of the common emitter transistor 40 may be coupled to a ground potential, or any other suitable potential, or any other suitable circuit for biasing the emitter 50 of common emitter transistor 40. As previously stated, the bias of the common emitter transistor 40 is substantially constant. Since the bias current source 52 is substantially constant, the bias current in the base 46 of the common emitter transistor 40 is substantially constant, and therefore, the bias current in the emitter 50 of the common emitter transistor 40 is substantially constant.

The second intermediate fixed gain stage 24 includes common base transistor 42 having a base 56 coupled to a second reference potential 59 in order to bias the common base transistor 42. The common base transistor 42 may be a bipolar transistor, a FET transistor, or any suitable transistor, as known in the art. For example, the base 56 of common base transistor 42 is coupled to a reference potential 59 such as a power supply voltage $V_+$ via a biasing resistor 58. The base 56 of common base transistor 42 may optionally be coupled to the ground potential 53 via a capacitor 60, for providing a small signal ground potential to base 56 as is known in the art. The common base transistor 42 also includes an emitter 62 coupled to the collector 48 of the common emitter transistor 40 to produce the first intermediate signal 30. The common base transistor 42 also includes a collector 64 to produce the output signal 18 in response to the first intermediate signal 30. The collector 64 is coupled to the second reference potential 59 via a biasing resistor 66 for biasing collector 64. However, the collector 64 of common base transistor 42 may employ any suitable biasing circuit known in the art. Since the first intermediate signal 30 is not directly coupled to either the output signal 18 or the input signal 20, the first intermediate signal 30 is one of the most isolated signals in the cascade amplifier stage 12. As a result, a change in the amplitude of the first intermediate signal 30 will not substantially affect the input and output impedance of the amplifier stage 12.

The gain control circuit 44 includes a gain control transistor 70, a first intermediate reactive element 78, an isolation resistor 80, and a bias isolation resistor 82. According to one embodiment, the gain control transistor 70 is an FET transistor, including gate 72, a drain 74, and a source 76; however, the gain control transistor 70 may be any type of transistor, such as a bipolar transistor or any suitable type of transistor device or circuit, such as an NMOS switch or a switchable attenuator as known in the art may be used. The gate 72 of the gain control transistor 70 receives the gain control signal 32. The drain 74 of the gain control transistor 70 controls the first intermediate signal 30 via the first intermediate reactive element 78. According to one embodiment, the first intermediate reactive element 78 may be, for example, a DC block capacitor, however, any suitable device may be used as known in the art. The drain 74 of the gain control transistor 70 varies the amplitude of the intermediate signal 30 to control the variable gain of the variable gain control amplifier 10. The source 76 is coupled to the first reference potential 53 such as a ground, or any suitable bias potential.

According to one embodiment, the isolation resistor 80 may be coupled between the source 76 and the drain 74 of the gain control transistor 70 in order to keep the drain 74 and the source 76 at the same DC potential so that the gain control transistor 70 will be biased and therefore turned on. For example, the value of the isolation resistor 80 is selected so that the gain control transistor 70 may be biased on. Additionally, the value of the gain control transistor is also selected so that the drain 74 is isolated sufficiently from the source 76 such that the first intermediate signal 30 is sufficiently isolated from the first reference potential 53. According to another embodiment, the isolation resistor 80 limits the maximum gain for the gain range of the variable gain control amplifier 10. According to one embodiment, the drain 74 to source 76 impedance of the gain control transistor 70 is much lower than the resistance of the isolation resistor 80. According to one embodiment, a resistance of the isolation resistor 80 may be 50 k Ohms ($\Omega$) or any suitable resistance.

According to one embodiment the drain 74 of the gain control transistor 70 reduces the amplitude of the first intermediate signal 30 to decrease the gain of the variable gain control amplifier 10. For example, the gain control transistor 70 may reduce the amplitude of the first intermediate signal 30 by decreasing the drain 74 to source 76 impedance of gain control transistor 70 so that the impedance between the first reference potential 53 via source 76 and the drain 74 decreases. Conversely, the drain 74 increases the amplitude of the first intermediate signal 30 to increase the gain of the variable gain control amplifier 10. For example, the gain control transistor 70 may increase the amplitude of the first intermediate signal 30 by increasing the drain 74 to source 76 impedance of the gain control transistor 70 so that a high impedance for the drain 74 to source 76 of gain control transistor 70 allows the amplitude of the first intermediate signal 30 to increase accordingly.

According to one embodiment, the drain 74 of the gain control transistor 70 within gain control circuit 44 automatically adjusts the gain of the variable gain control amplifier 10 such that the amplitude of the output signal 18 remains substantially constant. For example, the feedback circuit 16 may sense the amplitude of the output signal 18 or the sensed output signal 34 and provide the gain control signal 32 to the gain control transistor 70 via the gate 72 so that the drain 74 to source 76 impedance of gain control transistor 70 automatically adjusts the amplitude of the first intermediate signal, as described above, until the appropriate amplitude of output signal 18 is detected by feedback circuit 16. Alternatively, any other suitable device or method may be used to automatically adjust the amplitude of output signal 18 to any desirable level.

An internal gain of the common emitter transistor 40 and an internal gain of the common base transistor 42 are substantially constant for any gain within the gain range of the variable gain control amplifier 10. For bipolar transistors, the DC gain, commonly known as Hfe or B(BETA) and the small signal gain, hfe or β(beta), for both the common emitter transistor 40 and the common base transistor 42 remain substantially constant. Although the transistors in the first intermediate fixed gain stage 22 and the second intermediate fixed gain stage 24 were described as bipolar transistors, FET transistors may be used, or any other suitable type of transistor. For example, if the first intermediate fixed gain stage 22 and the second intermediate fixed gain stage 24 employ FET transistors, then the internal gain of the FET transistors, known as the GM or gm transconductance remains substantially constant.

As previously described, gain control circuit 26 automatically adjusts the gain of the variable gain control amplifier 10 in response to the gain control signal 32 such that an amplitude of the output signal 18 remains substantially constant. For example, the gain of the variable gain control amplifier 10 may range from 0 dB to 15 dB, or the range may be any suitable gain range such as 0 to 10 dB, 5 dB to 20 dB, and so forth. Since the amplitude of the output signal 18 remains constant, if the input signal 20 increases, then the gain of the variable gain control amplifier 10, defined previously as the ratio of the output signal 18 divided by the input signal 20, automatically decreases to a level within the gain range in response to the increase in amplitude of the input signal 20. Accordingly, the variable gain control amplifier 10 provides automatic gain control within the gain range such that an amplitude of the output signal 18 remains substantially constant without affecting the input impedance or output impedance of the variable gain control amplifier 10 and without affecting the noise figure or the third order intercept products substantially.

As previously stated, the noise figure of the amplifier stage 12 is the ratio between the signal to noise ratio at the output of the amplifier stage 12 and the signal to noise ratio at the input of the amplifier stage 12. The noise figure relates to the amount of noise that the amplifier stage 12 adds to the input signal 20 and that is subsequently produced at the output signal 18. Since the noise figure of the variable gain control amplifier 10 is substantially constant, the noise figure requirement is met for any suitable amplitude requirement of the input signal 20 and any suitable gain requirement of the variable gain control amplifier 10.

The second order harmonic intercept relates to the sum and difference products of at least two signal frequencies, such as one signal frequency denoted by $F_1$, and a second signal frequency denoted by $F_2$, such that the sum product is $F_1+F_2$ and the difference product is denoted by $F_1-F_2$. The third order harmonic intercept frequencies of importance are $(2 \cdot F_1 - F_2)$ and $(2 \cdot F_2 - F_1)$ that fall within the frequency band of interest. According to one embodiment, the input third order harmonic intercept is substantially constant, and therefore the harmonic intercept requirement is met for any gain requirement of the variable gain control amplifier 10. For example, the input third order harmonic intercept is known to remain substantially constant for certain fixed bias transistors and input matching circuits.

As previously stated, each intermediate stage of the amplifier stage 12 has a substantially constant gain. The gain of the individual intermediate stage transistors, for both a DC gain (HFE), and a small signal gain (hfe) remains substantially constant. Unlike prior automatic gain control circuits, the DC gain and the small signal gain of each intermediate transistor stage of the variable gain control amplifier 10 remains substantially constant, and as a result, the input and output impedances are also substantially constant. As previously stated, although the automatic gain control amplifier 10 may have a range of variable gain, such as for example from 0 dB to 15 dB of gain, each individual intermediate fixed gain stage 22, 24 has a fixed internal gain both from a small signal and a DC perspective.

Since, as previously stated, the input and output impedances of the variable gain control amplifier 10 are substantially constant, the input and output reflection S-parameter coefficients such as $S_{11}$ and $S_{22}$, as known in the art, are substantially constant as well. Since the input and output impedances of the variable gain control amplifier 10 are substantially constant, then matching circuits for the input and output are simplified since impedance variation compensation circuits are greatly simplified or eliminated. For example, if an antenna is coupled to the input of the variable gain control amplifier 10 and the antenna has a standardized impedance of, for example, 50 Ω then the input of the variable gain control amplifier 10 may be designed for a constant 50 Ω match with the antenna independent of the gain of the variable gain control amplifier. The resulting impedance matching circuit is simplified because the input impedance will not change substantially regardless of any changes to the overall gain of the variable gain control amplifier 10. As a result, since the impedance match between the antenna and the input of the variable gain control amplifier 10 is relatively constant, then the input reflection coefficient will be relatively constant and as a result, the antenna receives the input signal 20 with an appropriately low signal reflection.

Since the output impedance of the variable gain control amplifier 10 is substantially constant, matching the output of the variable gain control amplifier 10 with a subsequent stage, such as the receiver, will result in a simplified impedance matching circuit. Further, the output will also result in an efficient coupling such that the output signal 18 will be substantially transmitted to the subsequent stage such as the receiver. Therefore, the output will have a correspondingly low reflected output signal 18 and a corresponding low output reflection coefficient.

Figure 4:
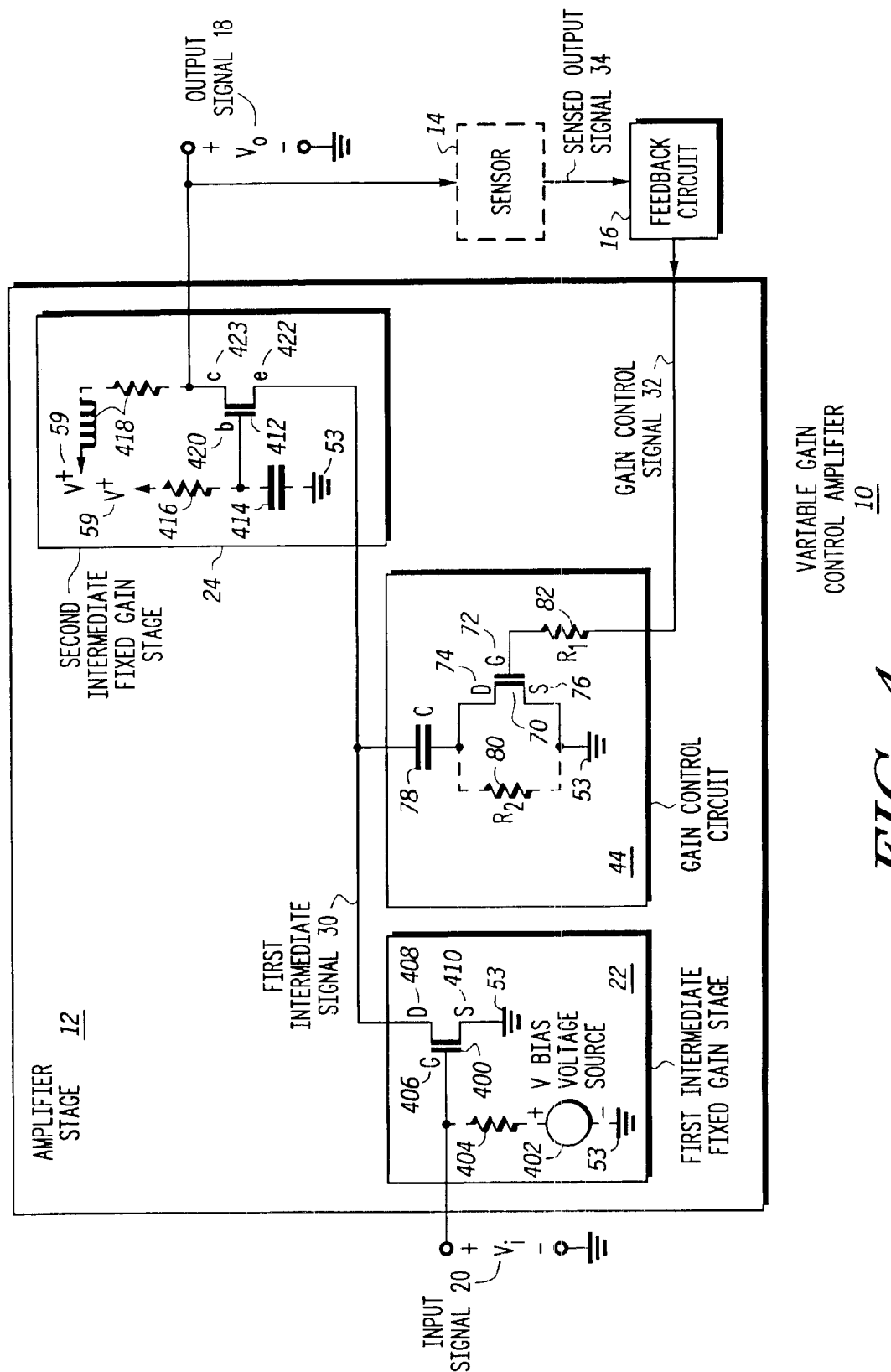
FIG. 4 is a block diagram illustrating another exemplary variable gain low noise cascode amplifier stage according to yet another embodiment of the invention.

FIG. 4 is a schematic diagram of the variable gain control amplifier 10, according to an alternative embodiment, employing a cascode transistor configuration within the amplifier stage 12. According to this exemplary embodiment, the at least first intermediate fixed gain stage 22 includes a common source transistor 400, an optional bias voltage source 402, and a bias resistor 404. The common source transistor 400, includes a gate 406, a drain 408, and a source 410 coupled to the first reference potential 53. The gate 406 receives the input signal 20.

The second intermediate fixed gain stage 24 includes a common gate transistor 412, a bias capacitor 414, a gate biasing resistor 416, and a drain biasing resistor 418. The common gate transistor 412 includes a gate 420 coupled to the second reference potential 59 via the gate biasing resistor 416. The common gate transistor 412 also includes a source 422 coupled to the drain 408 of the common source transistor 400 to produce the first intermediate signal 30.

The common gate transistor 412 includes a drain 423 operative to produce the output signal 18 in response to the first intermediate signal 30. The common gate transistor 412 may be biased by providing the second reference potential, V+59 to the gate 420 via the gate biasing resistor 416. Gate 420 is optionally coupled to the bias capacitor 414 where bias capacitor 414 is coupled to the first reference potential 53, such as the ground reference potential. The drain 423 of the common gain transistor 412 may be coupled to second reference potential 59 via drain biasing resistor 418. As previously stated, the common source transistor 400 and the common gate transistor 412 may have a transconductance, denoted by $g_m$ and Gm, that is substantially constant, although the gain of the variable gain control amplifier 10 may vary. Further, although the common source transistor 400 and the common gate transistor 412 are shown as N-channel transistors, these transistors may alternatively be any other type of device, including P-channel transistors or any other suitably configured device.

Figure 5:
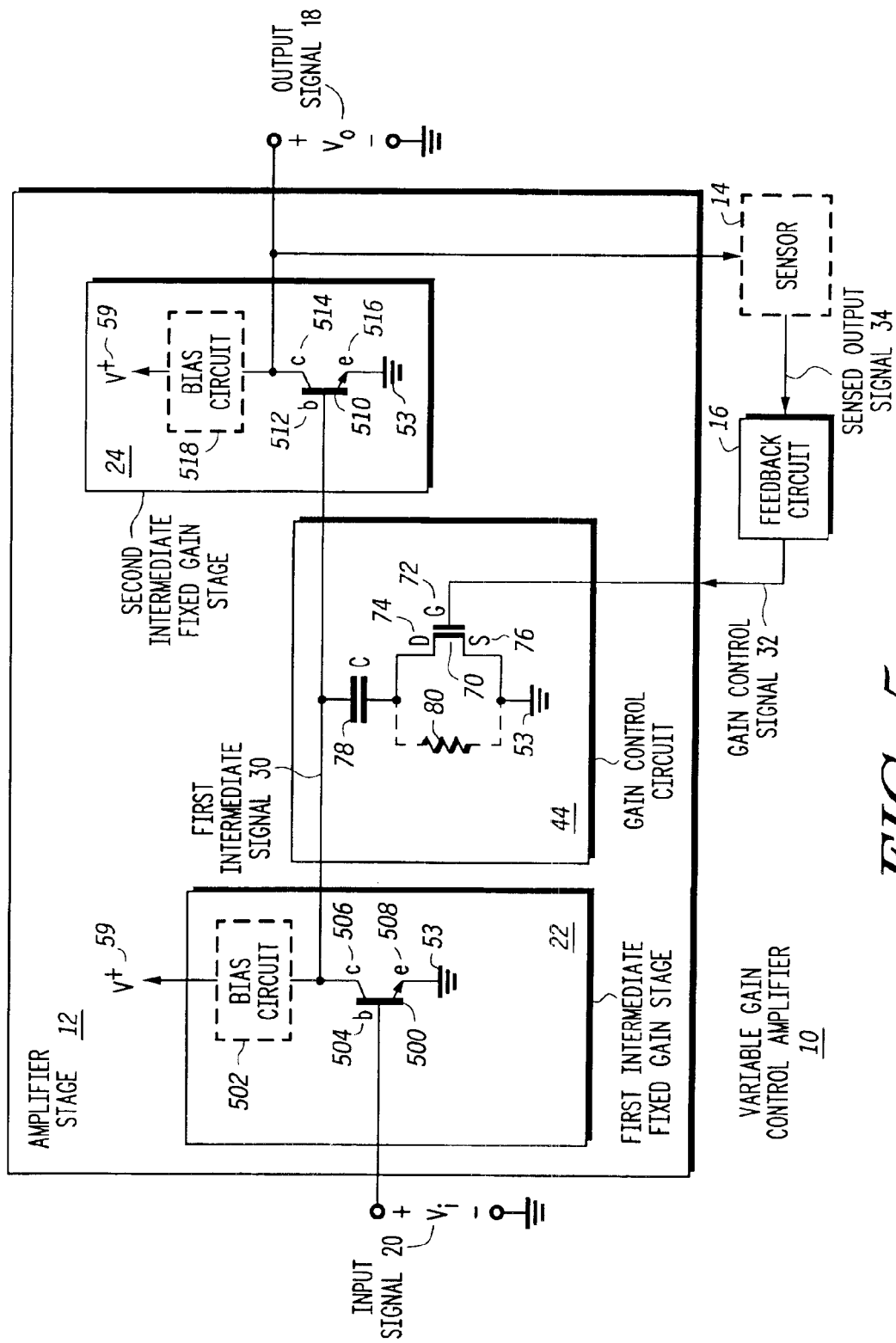
FIG. 5 is a block diagram illustrating an exemplary variable gain low noise cascade amplifier stage according to another embodiment of the invention.

FIG. 5 is a schematic diagram of a cascade variable gain control amplifier 10 including amplifier stage 12, optional sensor 14 and feedback circuit 16. The cascade configuration of the amplifier stage 12 includes the at least first intermediate fixed gain stage 22, the gain control circuit 44 and the at least second intermediate fixed gain stage 24. The at least first intermediate fixed gain stage 22 includes a first cascade common emitter transistor 500 and a bias circuit 502. The first cascade common emitter transistor 500 has a base 504 to receive the input signal 20, a collector 506, and an emitter 508 coupled to the first reference potential 53, such as the ground reference potential. The bias circuit 502 may be any circuit for biasing the collector 506 of the first cascade common emitter transistor 500 such as, for example, a bias resistor, transistor, or any suitable device coupled to the second reference potential 59.

The second cascade emitter transistor 510 includes a base 512, a collector 514, and an emitter 516. The base 512 is coupled to the collector 506 of the first cascade common emitter transistor 500 to produce the first intermediate signal 30. For example, in response to receiving the input signal 20 on the base 504, the generation of the first intermediate signal 30 from the collector 506 of the first cascade common emitter transistor 500 is known in the art. The collector 514 of second cascade common emitter transistor 510 produces the output signal 18 in response to the first intermediate signal 30 also in a manner known in the art. A bias circuit 518 may be any suitable circuit such as a transistor or resistor for biasing the collector 514 of the second cascade emitter transistor 510. The emitter 516 of the second cascade common emitter transistor 510 is coupled to the first reference potential 53 such as, for example, the ground potential or any suitable bias potential. For example, the emitter 516 may be coupled to the first reference potential 53 via a direct coupling, or alternatively via a biasing circuit or any other suitable device.

The gain control circuit 44 is similar to the gain control circuit 44 described with respect to FIGS. 3 and 4. The drain 74 of the gain control transistor 70 is coupled to control the first intermediate signal 30 via the first intermediate reactive element 78, such as a DC block capacitor, in order to control the amplitude of the first intermediate signal 30. The node formed between the collector 506 of the first cascade common emitter transistor 500 and the base 512 of the second cascade common emitter transistor 510 is not directly coupled to either the input signal 20 or the output signal 18. As a result, a variation of the amplitude of the first intermediate signal 30 does not substantially affect either the input or output impedance of the variable gain control amplifier 10.

Figure 6:
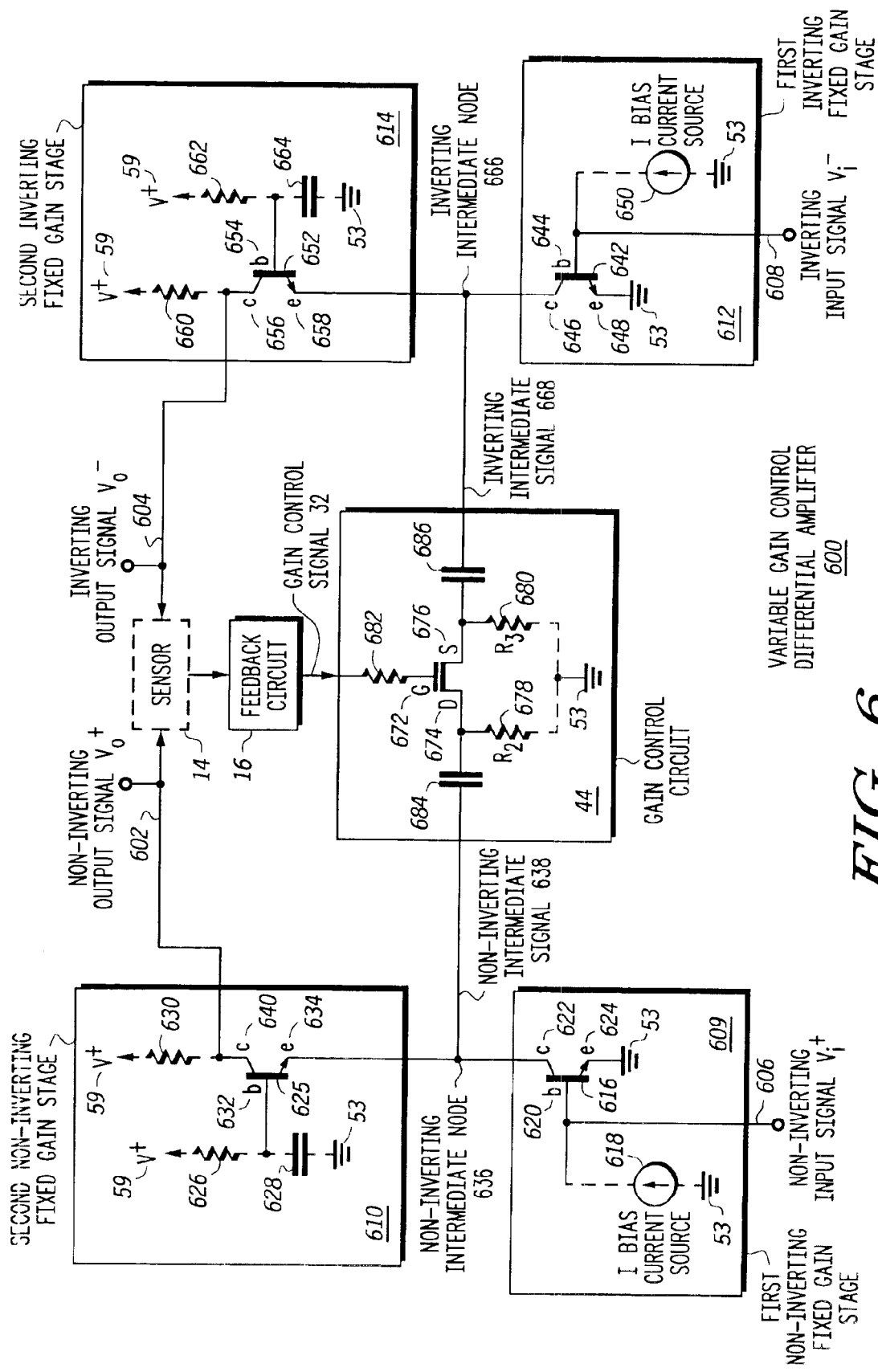
FIG. 6 is a block diagram illustrating an exemplary variable gain low noise differential amplifier stage according to another embodiment of the invention.

FIG. 6 is a schematic diagram of a variable gain control differential amplifier 600 having a variable gain and is operative to produce, a noninverting output signal 602 and an inverting output signal 604, in response to a noninverting input signal 606, and an inverting input signal 608. The variable gain control differential amplifier 600 includes a first common emitter fixed gain stage 609, a first common base fixed gain stage 610, a second common emitter fixed gain stage 612, a second common base fixed gain stage 614, the gain control circuit 44, the optional sensor 14 and the feedback circuit 16.

The first common emitter fixed gain stage 609 includes a common emitter transistor 616 and a bias current supply 618. The common emitter transistor 616 includes, a base 620, a collector 622, and an emitter 624 coupled to the first reference potential 53, such as a ground reference potential. The base 620 is operative to receive the noninverting input signal 606.

The first common base fixed gain stage 610 includes a common base transistor 625, a base biasing resistor 626, a bias capacitor 628, and a collector biasing resistor 630. The common base transistor 625 includes a base 632, an emitter 634, and a collector 640 operative to produce the noninverting output signal 602 in response to a noninverting intermediate signal 638 in a similar manner as previously described. The collector 640 is coupled to second reference potential 59 via resistor 630 to bias the common base transistor 625. The emitter 634 of the common base transistor 625 is coupled to the collector 622 of the common emitter transistor 616 of the first common emitter fixed gain stage 609 to form the noninverting intermediate node 636, and is operative to produce the noninverting intermediate signal 638 in response to the noninverting input signal 606. The base 632 of the common base transistor 625 is coupled to the second reference potential 59 via resistor 626. The base 632 is optionally coupled to the first reference potential 53 via the bias capacitor 628.

The second common emitter fixed gain stage 612 includes a common emitter transistor 642 including a base 644, a collector 646, an emitter 648, and a bias current source 650. The emitter 648 is coupled to the first reference potential 53, such as the ground reference potential. The base 644 receives the inverting input signal 608. The base 644 is also optionally coupled to the bias current source 650 as is known in the art to bias the common emitter transistor 642.

The second common base fixed gain stage 614 includes a common base transistor 652, a collector bias resister 660, a base bias resistor 662, and an optional base capacitor 664. The common base transistor 652 includes a base 654, a collector 656, and an emitter 658. The base 654 is coupled to the second reference potential 59 via base bias resistor 662. The base 654 is optionally coupled to the first reference potential 53 via base capacitor 664. The emitter 658 is coupled to the collector 646 of the common emitter transistor 642 of the second common emitter fixed gain stage 612 to form the inverting intermediate node 666 and is operative to produce an inverting intermediate signal 668 in response to the inverting intermediate signal 608. The collector 656 produces the inverting output signal 604 in response to the inverting intermediate signal 668. The collector 656 is coupled to second reference potential 59 via collector bias register 660 to bias the common base transistor 652.

Feedback circuit 16 produces the gain control signal 32 in response to the inverting output signal 604 and the noninverting output signal 602. For example, feedback circuit 16 may be directly coupled to receive the noninverting signal 602 and the inverting output signal 604 in order to produce the gain control signal 32. Accordingly, feedback circuit 16 may include a differential amplifier coupled to a device such as an analog digital converter, a phase lock loop, a processor such as a digital signal processor, or any suitable device and a storage medium containing a table for mapping the gain control signal 32 in response to receiving the noninverting output signal 602, and the inverting output signal 604.

The gain control circuit 44 is coupled between the noninverting intermediate node 636 and the inverting intermediate node 666 controls an amplitude of the inverting intermediate signal 668 and an amplitude of the noninverting intermediate signal 638 in response to the gain control signal 32. According to one embodiment, the gain control circuit 44 includes a gain control transistor 670, a drain resistor 678, a source resistor 680, a gate resistor 682, a noninverting DC block capacitor 684, and an inverting DC block capacitor 686. The gain control transistor 670 includes a gate 672, a drain 674, and a source 676. The gate 672 of the gain control transistor 670 receives the gain control signal 32 from feedback circuit 16 via the gate resistor 682. Drain resistor 678 and source resistor 680 function to keep the drain 674 and the source 676 at the same potential and to allow the gain control transistor 670 to be biased "on" when an appropriate gain control signal 32 is provided to the gate 672. The values for the drain resistor 678 and the source resistor 680 may be selected so that the drain to source impedance of gain control transistor 670 is much lower than the resistance of drain resistor 678 and the source resistor 680. Noninverting capacitor 684 and inverting capacitor 686 function as DC block capacitors. As previously stated, any suitable device for blocking DC signals may be used as suitably known in the art.

Figure 7:
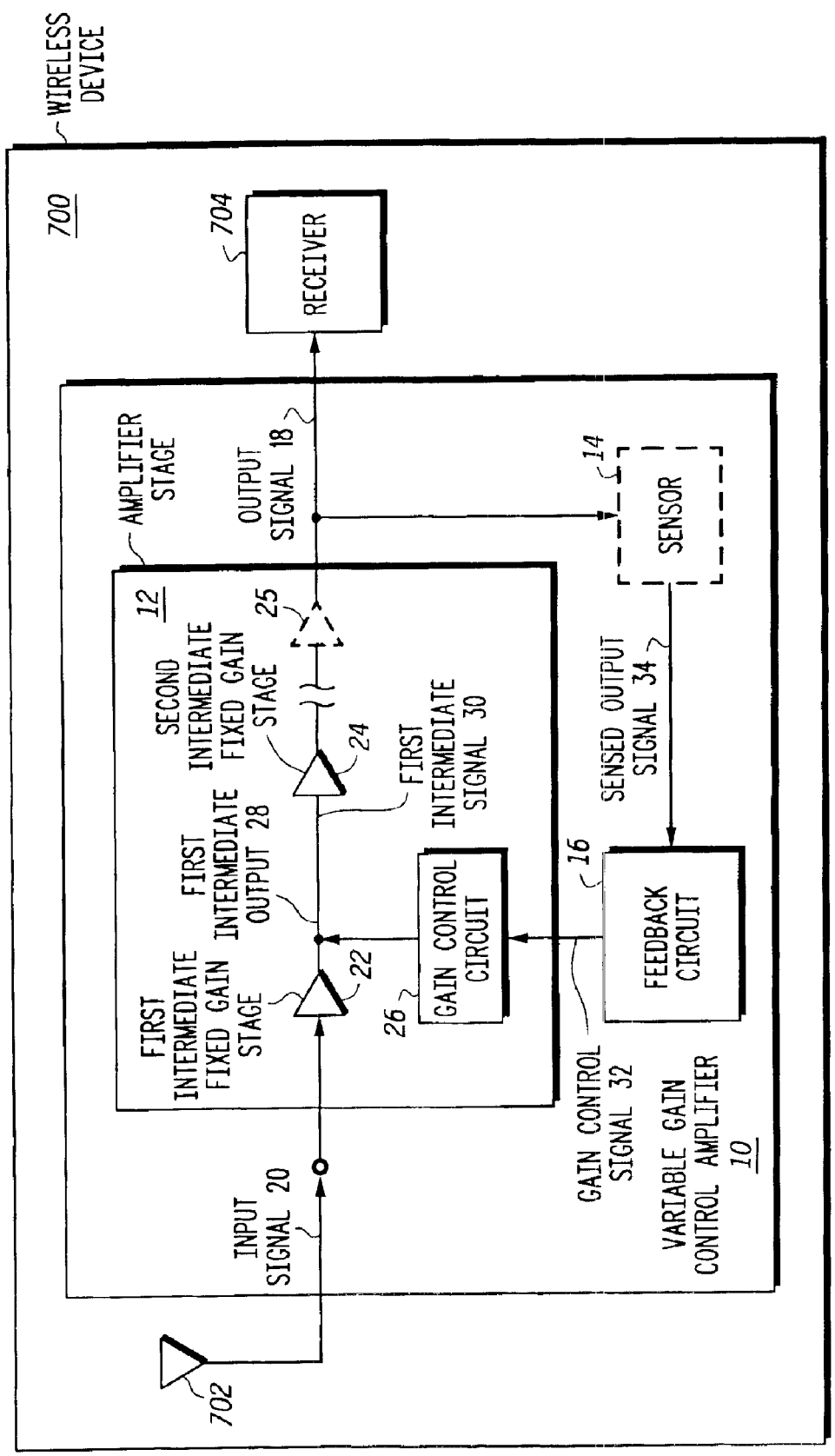
FIG. 7 is a block diagram illustrating one example of a wireless device according to one embodiment of the invention.

FIG. 7 is a block diagram of a wireless device 700 including variable gain control amplifier 10, antenna 702, and receiver 704. The variable gain control amplifier 10 includes amplifier stage 12, sensor 14, and feedback circuit 16 as previously described with respect to FIG. 1. Receiver 704 is operative to receive the output signal 18 of variable gain control amplifier 10. The gain control circuit 26 automatically adjusts the gain of the variable gain control amplifier 10 in response to the gain control signal 32 such that an amplitude of the output signal 18 remains substantially constant. Accordingly, the receiver 704 may, for example, readily convert the output signal 18 to an intermediate frequency (IF) or to base band data directly and demodulate the output signal 18 at a constant amplitude irrespective of the amplitude variations of the input signal 20.

Since the output impedance of the variable gain control amplifier 10 is relatively constant, a proper impedance match between the output of the variable gain control amplifier 10 and an input of receiver 704 is properly maintained. Similarly, the impedance match between antenna 702 and the input of variable gain control amplifier 10 may be properly maintained because the input impedance of the input of the variable gain control amplifier 10 is constant. Further, since the internal gain of the first intermediate fixed gain stage 22, and the second intermediate gain stage 24 is substantially constant, the noise figure of the amplifier stage 12 is substantially constant. According to one embodiment, the variable gain control amplifier 10 provides automatic gain control for a low noise amplifier (LNA).

It will be understood that the implementation of other variations and modifications of the invention and its various aspects will be apparent to those with the ordinary skill in the art, and that the invention is not limited by this specific embodiment as described. For example, the amplifier stage 12 may include three or more intermediate gain stages 25. Accordingly, gain control circuit 26 may adjust the amplitude of one or more intermediate signals between corresponding intermediate gain stages. Further, amplifier stage 12 may include one or more gain control circuits 26 to provide corresponding intermediate signals for controlling the gain of the variable gain control amplifier. It is therefore contemplated to cover by the present invention any and all modifications, variations or equivalents that fall within the spirit and scope of the basic underlying principles disclosed and claimed herein.

What is claimed is:

1. A variable gain control amplifier operative to produce an output signal in response to an input signal, comprising:
    an amplifier stage including at least a first intermediate fixed gain stage, operative to produce a first intermediate signal in response to the input signal, and at least a second intermediate fixed gain stage operative to produce the output signal in response to the first intermediate signal;
    a feedback circuit operative to produce a gain control signal in response to the output signal; and
    a gain control circuit, operatively coupled to the first intermediate fixed gain stage and the second intermediate fixed gain stage, and operatively responsive to the gain control signal to control an amplitude of the intermediate signal; and
    wherein the gain control circuit reduces the amplitude of the intermediate signal to decrease a gain of the variable gain control amplifier, and increase the amplitude of the intermediate signal to increase the gain of the variable gain control amplifier.

2. The variable gain control amplifier of claim 1, wherein the gain control circuit automatically controls the amplitude of the intermediate signal to adjust a gain of the variable gain control amplifier in response to the gain control signal such that an amplitude of the output signal remains substantially constant for input signals above certain level.

3. The variable gain control amplifier of claim 1 wherein the feedback circuit further comprises a storage element including data representing a storage element table containing at least gain control data for producing the gain control signal in response to the output signal.

4. The variable gain control amplifier of claim 3, wherein:
    the gain control circuit automatically adjusts the gain of the variable gain control amplifier in response to the gain control signal such that an amplitude of the output signal remains substantially constant,
    wherein the gain control circuit reduces the amplitude associated with the intermediate signal level to decrease the gain of the variable gain control amplifier, and
    wherein the gain control circuit increases the amplitude associated with the intermediate signal level to increase the gain of the variable gain control amplifier.

5. The variable gain control amplifier of claim 1, wherein the amplifier stage produces at least one of: a substantially constant gain for the first intermediate fixed gain stage, a substantially constant gain for the second intermediate gain stage, a substantially constant third order intercept harmonic, and a substantially constant noise figure within a range of variable gain of the variable gain control amplifier. The variable gain control amplifier of claim 1, wherein the amplifier stage is at least one of: a single-ended amplifier, a differential amplifier, a cascade amplifier, and a cascode amplifier.

6. The variable gain control amplifier of claim 1, wherein the amplifier stage is at least one of: a single-ended amplifier, a differential amplifier, a cascade amplifier, and a cascode amplifier.

7. The variable gain control amplifier of claim 1 wherein:
    the at least first intermediate fixed gain stage further includes;
    a common emitter transistor including a base operative to receive the input signal, a collector, and an emitter operatively coupled to a first reference potential; and
    wherein the at least second intermediate fixed gain stage further includes;
    a common base transistor including a base operatively coupled to a second reference potential, an emitter coupled to the collector of the common emitter transistor and operative to produce the first intermediate signal, and a collector operative to produce the output signal in response to the first intermediate signal.

8. The variable gain control amplifier of claim 7, wherein the gain control circuit comprises:
    a gain control transistor including a gate, a drain, and a source, wherein the gate is operative to receive the gain control signal, the drain is coupled to the collector of the common emitter transistor and the emitter of the common base transistor, via a first intermediate reactive element, wherein the drain of the gain control transistor varies the amplitude of the intermediate signal to control the variable gain of the variable gain control amplifier, wherein the source is operatively coupled to the first reference potential.

9. The variable gain control amplifier of claim 8, further comprising an isolation resistor operatively coupled between the drain and the source of the gain control transistor, wherein the drain of the gain control transistor reduces the amplitude of the first intermediate signal to decrease the gain of the variable gain control amplifier, and the drain increases the amplitude of the first intermediate signal to increase the gain of the variable gain control amplifier.

10. The variable gain control amplifier of claim 8 wherein the drain of the gain control circuit automatically adjusts the gain of the variable gain control amplifier such that an amplitude of the output signal remains substantially constant.

11. The variable gain control amplifier of claim 7, wherein an internal gain of the common emitter transistor and an internal gain of the common base transistor remains substantially constant.

12. The variable gain control amplifier of claim 1 wherein:
the at least first intermediate fixed gain stage further includes:
a common source transistor including a gate, a drain, and a source operatively coupled to a first reference potential, wherein the gate is operative to receive the input signal; and
wherein the at least second intermediate fixed gain stage further includes: a common gate transistor including a gate operatively coupled to a second reference potential, and a source coupled to the drain of the common source transistor to produce the first intermediate signal, a drain operative to produce the output signal in response to the first intermediate signal.

13. The variable gain control amplifier of claim 12, wherein the gain control circuit comprises:
a gain control transistor including a gate, a drain, and a source, wherein the gate is operative to receive the gain control signal, the drain is coupled to the drain of the common source transistor and the source of the common gate transistor, via a first intermediate reactive element, wherein the drain of the gain control transistor varies the amplitude of the intermediate signal level to control the variable gain of the variable gain control amplifier, and the source is operatively coupled to the first reference potential; and
an isolation resistor operatively coupled between the drain and the source of the gain control transistor.

14. The variable gain control amplifier of claim 1 wherein:
the at least first intermediate fixed gain stage further includes:
a first cascade common emitter transistor including a base operative to receive the input signal, a collector, and an emitter operatively coupled to a first reference potential; and
wherein the at least second intermediate fixed gain stage further includes:
a second cascade common emitter transistor including a base coupled to the collector of the first cascade common emitter transistor and operative to produce the first intermediate signal, a collector operative to produce the output signal in response to the first intermediate signal, and an emitter operatively coupled to the first reference potential.

15. The variable gain control amplifier of claim 14, wherein the gain control circuit comprises:
a gain control transistor including a gate, a drain, and a source, wherein the gate is operative to receive the gain control signal, the drain is coupled to the collector of the first cascade common emitter transistor and the base of the second cascade common emitter transistor via a first intermediate reactive element, wherein the drain of the gain control transistor varies the amplitude of the intermediate signal to control the variable gain of the variable gain control amplifier, the source is operatively coupled to the first reference potential; and an isolation resistor operatively coupled between the drain and the source of the gain control transistor.

16. A variable gain control differential amplifier including a variable gain, operative to produce a noninverting output signal and an inverting output signal, in response to a noninverting input signal, and an inverting input signal, the variable gain control differential amplifier comprising:
a first common emitter fixed gain stage including:
a common emitter transistor including a base, a collector, and an emitter operatively coupled to a first reference potential, wherein the base is operative to receive the noninverting input signal;
a first common base fixed gain stage including:
a common base transistor including a base operatively coupled to a second reference potential, an emitter coupled to the collector of the common emitter transistor of the first common emitter fixed gain stage to form a noninverting intermediate node and operative to produce a noninverting intermediate signal in response to the noninverting input signal, and a collector operative to produce the noninverting output signal in response to the noninverting intermediate signal;
a second common emitter fixed gain stage including:
a common emitter transistor including a base, a collector and an emitter operatively coupled to the first reference potential, wherein the base is operative to receive the inverting input signal;
a second common base fixed gain stage including:
a common base transistor including a base operatively coupled to the second reference potential, an emitter coupled to the collector of the common emitter transistor of the second common emitter fixed gain stage to form the inverting intermediate node and operative to produce an inverting intermediate signal in response to the inverting input signal, and a collector operative to produce the inverting output signal in response to the inverting intermediate signal;
a feedback circuit operative to produce a gain control signal in response to the inverting output signal and the noninverting output signal; and
a gain control circuit operatively coupled between the noninverting intermediate node and the inverting intermediate node and operative to control an amplitude of the inverting intermediate signal and an amplitude of the noninverting intermediate signal in response to the gain control signal.

17. A wireless device comprising:
an antenna operative to receive an input signal;
a variable gain control amplifier having a variable gain and operative to produce an output signal in response to the input signal, the variable gain control amplifier comprising:
an amplifier stage including at least a first intermediate fixed gain stage operative to produce a first intermediate signal in response to the input signal, and at least a second intermediate fixed gain stage operative to produce the output signal in response to the first intermediate signal;
a feedback circuit operative to produce a gain control signal in response to the output signal;
a gain control circuit operatively coupled to the first intermediate fixed gain stage and the second intermediate fixed gain stage, and operatively responsive to the gain control signal to reduce an amplitude of the intermediate signal wherein the gain control circuit reduces the amplitude of the intermediate signal to decrease a gain of the variable gain control amplifier, and increase the amplitude of the intermediate signal to increase the gain of the variable gain control amplifier; and a receiver operative to receive the output signal.

18. The wireless device of claim 17, wherein the gain control circuit automatically adjusts the gain of the variable gain control amplifier in response to the gain control signal such that an amplitude of the output signal remains substantially constant.

19. A method for controlling a variable gain of an amplifier, the method comprising:

producing an intermediate signal in response to an input signal by at least a first intermediate fixed gain stage;

producing an output signal in response to the intermediate signal by at least a second intermediate fixed gain stage;

producing a gain control signal in response to the output signal; and controlling an amplitude of the intermediate signal in response to the gain control signal.

20. The method for controlling the variable gain of the amplifier of claim 19, wherein in response to the gain control signal, the amplitude of the intermediate signal is automatically controlled such that an amplitude of the output signal remains substantially constant.

21. The method for controlling the variable gain of the amplifier of claim 19 wherein in response to the gain control signal, the method further comprising:

reducing the amplitude of the intermediate signal to reduce the variable gain; and increasing the amplitude of the intermediate signal to increase the variable gain.

* * * * *